United States Patent [19]

Hoekstra et al.

[11] Patent Number: 4,802,129
[45] Date of Patent: Jan. 31, 1989

[54] RAM WITH DUAL PRECHARGE CIRCUIT AND WRITE RECOVERY CIRCUITRY

[75] Inventors: George P. Hoekstra, Fair Oaks, Calif.; Perry H. Pelley, III, Austin, Tex.

[73] Assignee: Motorola, Inc., Schaumburg, Ill.

[21] Appl. No.: 128,559

[22] Filed: Dec. 3, 1987

[51] Int. Cl.$^4$ .......................... G11C 7/00; G11C 8/00
[52] U.S. Cl. ...................... 365/203; 365/233; 365/190; 365/194
[58] Field of Search .............. 365/190, 230, 233, 203, 365/194

[56] References Cited

U.S. PATENT DOCUMENTS 4,712,197 12/1987 Sood ..................... 365/203
4,722,074 1/1988 Fujishiwa et al. ............. 365/230

FOREIGN PATENT DOCUMENTS 59-221891 12/1984 Japan ..................... 365/190

Primary Examiner—Stuart N. Hecker
Assistant Examiner—Alfonso Garcia
Attorney, Agent, or Firm—James L. Clingan, Jr.

[57] ABSTRACT

A memory is written via data lines which are driven by a write driver. The data lines are coupled to a selected bit line pair as determined by a column address. The data lines are driven to a logic state representative of a data input signal by a write driver. The write driver is enabled during the presence of a write enable pulse. The write enable pulse is generated in response to a read mode to write mode transition and also in response to a transition of the data input signal. The data lines are precharged in response to a transition of the data input signal that occurs during the write mode.

7 Claims, 3 Drawing Sheets

4,802,129

RAM WITH DUAL PRECHARGE CIRCUIT AND WRITE RECOVERY CIRCUITRY

FIELD OF THE INVENTION

The present invention relates to random access memories (RAMs), and more particularly, to RAMs which must recover from a write before a read can be performed.

BACKGROUND OF THE INVENTION

In a typical static random access memory (SRAM) there is a period defined by an external write signal during which the logic state of a data input signal is written into a memory location defined by an address. There is typically a specification defining how long the write signal must remain active following a change in the data input signal. This is commonly known as data valid to write high (DVWH). There is also a data-hold specification which specifies how long the data input signal must be valid following the termination of write which is commonly phrased as write high to data don't care (WHDX). As access times get lower, both of these specifications must also get lower. As these specifications get lower there is a potential conflict with read access time because before a read can be performed the memory must first recover from the write.

The need for write recovery is addressed in U.S. Pat. No. 4,110,840, Abe et al, which teaches that there is problem associated with a read following a write. A write forces a selected bit line pair and a data line pair to a full rail or nearly full rail separation. During a write, one bit line of a selected bit line pair is driven to a voltage at or near one power supply terminal, and the other bit line of the selected bit line pair is driven to a voltage at or near the other power supply terminal. One problem of this full rail separation was that if there was a change in word line selection at the same time as a change from a write to read transition, a newly selected cell would be coupled to a bit line pair having full rail separation which could, due to the large bit line capacitance, reverse the data in the newly selected cell. The solution was to precharge the low bit line in response to switching from the write to read mode. This was achieved using the data lines. This approach is commonly used. Another approach has relied on address transition to perform the needed precharge and/or equalization of bit lines and data lines. These approaches have utility but are not fully satisfactory for providing the desired DVWH specification in a SRAM which has a self-timed write. A self-timed write is used in very high speed applications, such as when ECL and MOS are combined to make an SRAM.

SUMMARY OF THE INVENTION

An object of the present invention is to provide a memory with an improved write recovery circuit.

Another object of the invention is to provide an improved memory which must recover in the case of a write mode to read mode transition.

Yet another object of the invention is to provide a memory with an improved write mode to read mode transition.

These and other objects are achieved in a memory having a read mode and a write mode. The memory has an array of memory cells, a pair of data lines, an output circuit, an input circuit, a precharge circuit, a column decoder, and a row decoder. The array of memory cells is comprised of memory cells coupled to bit line pairs and word lines at intersections thereof. The output circuit provides an output signal representative of a logic state present on the data lines when the memory is in the read mode. The input circuit drives the data lines to a logic state representative of a logic state of an input signal during the write mode. The precharge circuit precharges the data lines in response to a change in the logic state of the input signal that occurs during the write mode. The column decoder couples a selected bit line pair to the data lines as determined by a column address. The row decoder enables a selected word line as determined by a row address.

DESCRIPTION OF THE INVENTION

Figure 1:
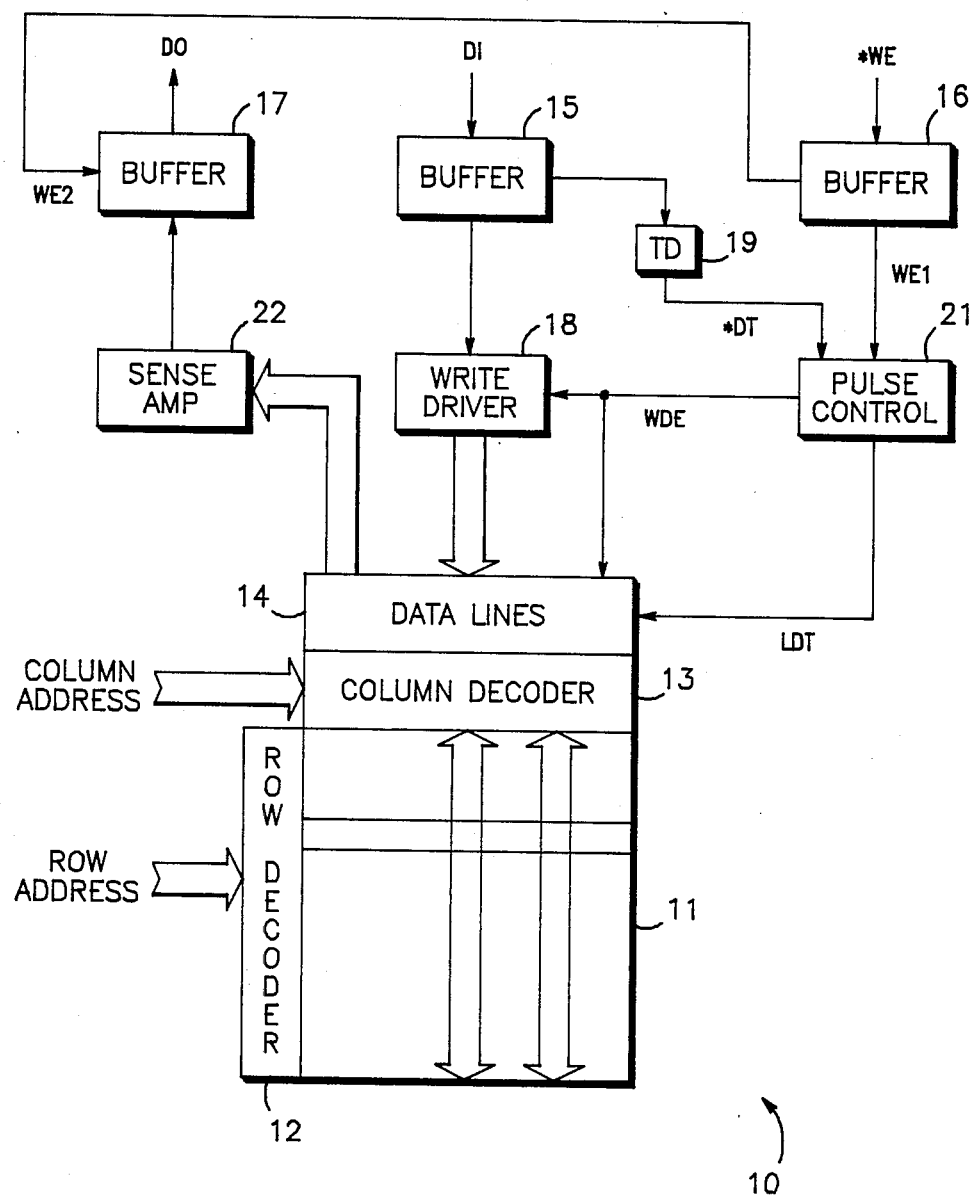
FIG. 1 is a block diagram of a memory according to a preferred of the invention.

Shown in FIG. 1 is a memory 10 comprised of an array 11, a row decoder 12, a column decoder 13, data lines 14, a data-in buffer 15, a write enable buffer 16, a data-out buffer 17, a write driver 18, a transition detector 19, a pulse control circuit 21, and a sense amplifier 22. Buffer 16 receives an externally provided write enable signal *WE which is active at a logic low and thus indicates that memory 10 is to be in a write mode when it is a logic low. The asterisk (*) in front of the signal designation indicates that the signal is active at a logic low. Signal *WE at a logic high indicates that memory 10 is in a read mode. Buffer 16 outputs a first write enable signal WE1 and a second write enable signal WE2 responsive to signal *WE for use by pulse control circuit 21 and buffer 17, respectively.

In general the operation of memory 10 is described in two modes, the read mode and the write mode. In the read mode, signal *WE is a logic high, and buffer 17 outputs a data-out signal DO representative of a logic state stored in a memory cell selected by a column address and a row address. Row decoder 12 selects a word line in array 11 as determined by the row address. All of the memory cells coupled to the selected word line are enabled. The memory cells in array 11 are coupled to word lines and bit line pairs at intersections thereof. When enabled, a memory cell either outputs data onto the bit line pair to which it is coupled or receives data from the bit line pair to which it is coupled. In the read mode, a selected memory cell outputs data onto the bit line pair to which it is coupled. Column decoder selects a bit line pair in response to a column address. Column decoder 13 accomplishes the selection by coupling the selected bit line pair to data lines 14. Sense amplifier 22 senses the logic state provided onto data lines 14 and outputs it to buffer 17 which in turn outputs signal DO in response to the logic state provided by sense amplifier 22.

In the write mode, the selection of a cell is accomplished in the same manner as in the read mode. In the write mode a selected bit line pair is driven to a logic state by virtue of data lines 14 being driven to a logic state by write driver 18. Write driver 18 drives data lines 14 to a logic state representative of the logic state of data-in signal DI received by buffer 15. Buffer 15 provides an output to write driver 18 representative of the logic state of signal DI. The selected bit line pair is coupled to data lines 14 so the selected bit line pair is driven to the logic state representative of the logic state of signal DI. The particular approach taken for the duration of a write is a timed write approach in which write driver is active for a duration defined by an internal write driver enable pulse WDE. Pulse control circuit 21 provides pulse WDE to write driver 18 responsive to signal WE1 and a pulse *DT. Pulse WDE is generated for a predetermined length of time, for example, 5 nanoseconds (ns), in response to either a transition of signal WE1 from a logic low to a logic high or a transition of signal DI while signal WE1 is a logic high. Pulse WDE is thus generated upon entry into the write mode and may also be again generated during the write mode if there is a data change during the write mode. Transition detector 19, coupled to buffer 15, detects a change in signal DI and provides data transition pulse *DT if there is a data change. Pulse WDE is also provided to data lines 14 for charging data lines 14 when write driver 18 is inactive. Pulse control circuit 21 also provides a late data-transition pulse LDT to data lines 14 for high speed charging of data lines 14 for the case in which there is a data change near the end of the write mode. Pulses WDE and LDT are provided to data lines 14 for write recovery of data lines 14 and the selected bit line pair.

Figure 2:
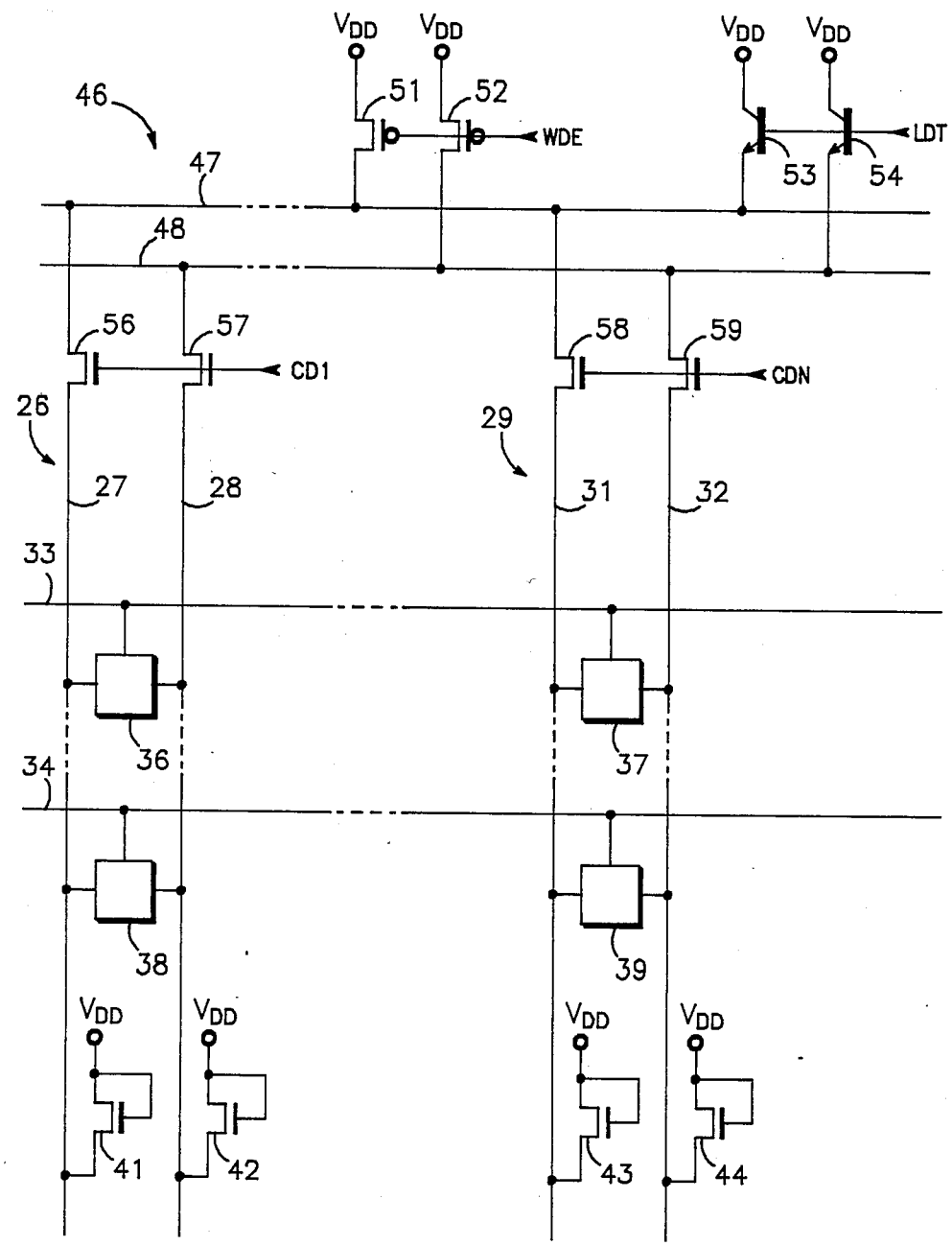
FIG. 2 is a circuit diagram of a first portion of the memory of FIG. 1.

Shown in FIG. 2 is portion of array 11, column decoder 13, and data lines 14. The portion of array 11 shown in FIG. 2 comprises a bit line pair 26 comprised of a bit line 27 and a bit line 28, a bit line pair 29 comprised of a bit line 31 and a bit line 32, a word line 33, a word line 34, a memory cell 36 coupled to word line 33 and bit lines 27 and 28, a memory cell 37 coupled to word line 33 and bit lines 31 and 32, a memory cell 38 coupled to word line 34 and bit lines 27 and 28, a memory cell 39 coupled to word line 34 and bit lines 31 and 32, a diode-connected N channel transistor 41 connected between a positive power supply terminal VDD and bit line 27, a diode-connected N channel transistor 42 connected between VDD and bit line 28, a diode-connected N channel transistor 43 connected between VDD and bit line 31, and a diode-connected N channel transistor 44 connected between VDD and bit line 32. Data lines 14 comprises a data line pair 46 comprised of a data line 47 and a data line 48, a P channel transistor 51, a P channel transistor 52, an NPN transistor 53, and an NPN transistor 54. The portion of column decoder shown in FIG. 2 comprises an N channel transistor 56, an N channel transistor 57, an N channel transistor 58, and an N channel transistor 59. Transistor 51 has a source connected to VDD, a gate for receiving pulse WDE, and a drain connected to data line 47. Transistor 52 has a source connected to VDD, a gate for receiving pulse WDE, and a drain connected to data line 48. Transistor 53 has a collector connected to VDD, a base for receiving pulse LDT, and an emitter connected to data line 47. Transistor 54 has a collector connected to VDD, a base for receiving pulse LDT, and an emitter connected to data line 48. Transistor 56 which uses the bilateral characteristic of MOS-type transistors, has a first current electrode connected to data line 47, a second current electrode connected to bit line 27, and a control electrode for receiving a column decoder signal CD1. Transistor 57 has a first current electrode connected to data line 48, a second current electrode connected to bit line 28, and a control electrode for receiving signal CD1. Transistor 58 has a first current electrode coupled to data line 47, a second current electrode coupled to bit line 31, and a control electrode for receiving column decoder signal CDN. Transistor 59 has a first current electrode connected to a data line 48, a second current electrode coupled to bit line 32, and a gate for receiving signal CDN.

When write driver 18 is active in driving data line pair 46, pulse WDE has pulsed to a logic high so that transistors 51 and 52 are non-conductive. When pulse WDE is inactive it is a logic low so that transistors 51 and 52 are conductive when memory 10 is not in the write mode. For the case in which the data changes after the write mode has already been entered, pulse LDT may be generated. If pulse LDT is generated, transistors 53 and 54 are conductive. Pulse LDT is generated only if the WDE pulse is extended beyond the termination of external signal *WE. This is the case in which write recovery must be most rapid because the termination of the write mode is the beginning of the read mode. Data line pair 46 and the selected bit line pair must be charged back to the precharge voltage prior to sensing. Thus, transistors 53 and 54 are enabled for the case where the actual writing occurs beyond the external termination of the write mode.

Figure 3:
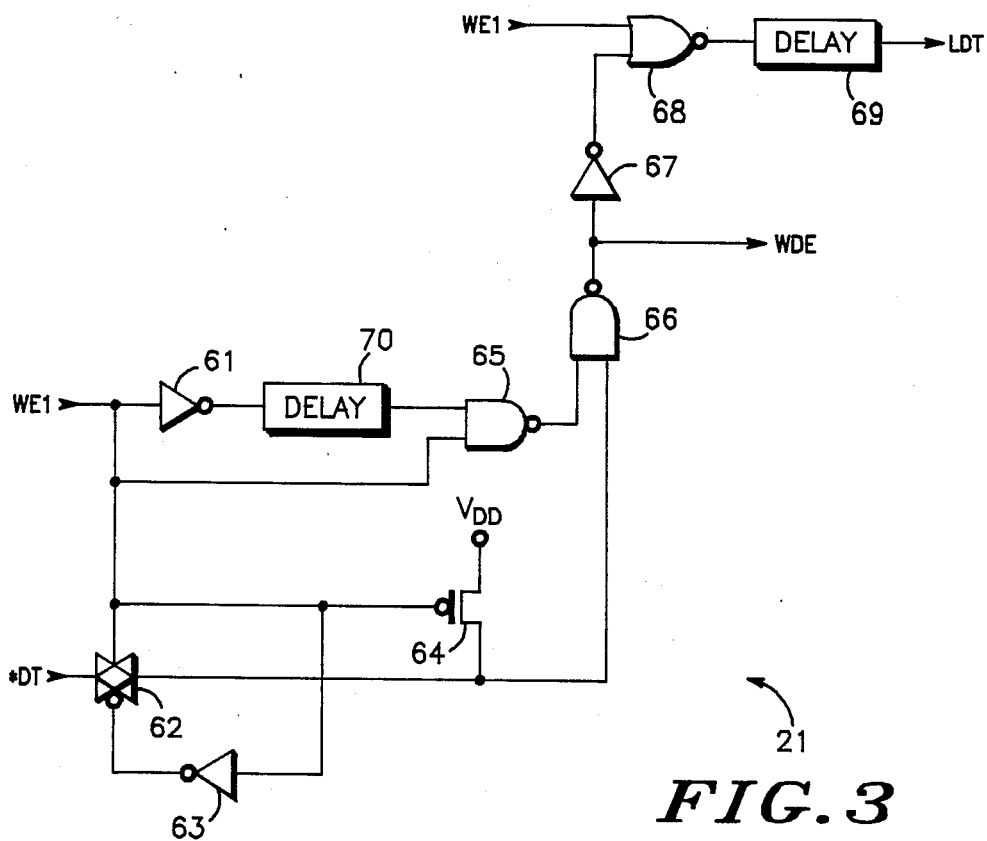
FIG. 3 is a circuit diagram of a second portion of the memory of FIG. 1.

Shown in FIG. 3 is pulse control circuit 21 which comprises an inverter 61, a transmission gate 62, a P channel transistor 64, a NAND gate 65, a NAND gate 66, an inverter 67, a NOR gate 68, a delay circuit 69, and a delay circuit 70. Inverter 61 has an input for receiving signal WE1, and an output. Delay circuit 70 has an input connected to the output of inverter 61, and an output. NAND gate 65 has a first input connected to the output of delay circuit 70, a second input for receiving signal WE1, and an output. Inverter 63 has an input for receiving signal WE1, and an output. Transmission gate 62 has a signal input for receiving pulse *DT, a true control input for receiving signal WE1, a complementary control input connected to the output of inverter 63, and a data output. Transistor 64 has a gate for receiving signal WE1, a source connected to VDD, and a drain connected to the data output of transmission gate 62. NAND gate 66 has a first input connected to the output of NAND gate 65, a second input connected to the data output of transmission gate 62, and an output for providing pulse WDE. Inverter 67 has an input connected to the output of NAND gate 66, and an output. NOR gate 68 has a first input connected to the output of inverter 67, a second input for receiving signal WE1, and an output. Delay circuit 69 has an input connected to the output of NOR gate 68, and an output for providing pulse LDT.

During the read mode, signal WE1 is a logic low so that transmission gate 62 is non-conductive, transistor 64 is conductive, and NAND gate 65 is forced to provide a logic high output. NAND gate 66 thus has a logic high on both inputs causing NAND gate 66 to provide pulse WDE at a logic low. With the output of NAND gate 66 at a logic low, inverter 67 outputs a logic high which forces NOR gate 68 to output a logic low which causes delay circuit 69 to output pulse LDT at a logic low. Thus during the read mode, pulses LDT and WDE are at a steady state logic low.

Figure 4:
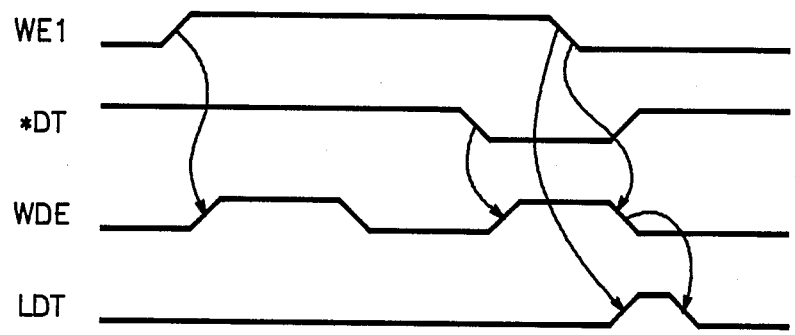
FIG. 4 is a timing diagram of signals present in the memory of FIG. 1.

Upon a transition of signal WE1 to a logic high which is caused by external signal *WE switching from a logic high to a logic low, NAND gate 65 will respond by providing a logic low output. Inverter 61 and delay circuit 70 cause a delay in the transition of signal WE1 reaching NAND gate 65. Thus upon the transition of signal WE1 switching to a logic high, both inputs of NAND gate 65 are temporarily a logic high so that NAND gate 65 outputs a logic low. The logic low output of NAND gate 65 forces NAND gate 66 to provide pulse WDE at a logic high. This responsiveness of pulse WDE to signal WE1 is shown in FIG. 4. After the delay of inverter 61 and delay circuit 70 lapses, the output of delay 70 becomes a logic low which forces NAND gate 65 to output a logic high. Both inputs of NAND gate 66 become a logic high which causes NAND gate 66 to output pulse WDE at a logic low. The duration of pulse WDE at a logic high is determined by the delay of inverter 61 and delay circuit 70. While WE1 is a logic high, pulse LDT is suppressed because the logic high of signal WE1 forces NOR gate 68 to output a logic low. Thus NOR gate 68 is unresponsive to the output of inverter 67 while signal WE1 is a logic high. Pulse *DT is a logic high except for a predetermined time duration following a transition of data-in signal DI. While signal WE1 is a logic high, transmission gate 62 couples pulse *DT to NAND gate 66. So long as there is no data change while signal WE1 is a logic high, NAND gate 66 will be responsive to the output of NAND gate 65. For a data change after signal WE1 has switched to a logic high, pulse *DT will pulse to a logic low which will force NAND gate 66 to output pulse WDE at a logic high. Inverter 67 will then output a logic low to NOR gate 68. For the case in which signal WE1 remains at a logic low, pulse WDE will remain at a logic high for the duration of pulse *DT at a logic low. The output of inverter 67 will switch back to a logic high. The more difficult case, however, is when signal WE1 switches to a logic low the specified minimum time following a data change. This specified minimum time is commonly known as the time from data valid to write high (DVWH). In such a case, signal WE1 switches to a logic low while pulse *DT is a logic low, pulse WDE is a logic high, and the output of inverter 67 is a logic low. Both inputs of NOR gate 68 are then at a logic low which causes the output of NOR gate 68 to switch to a logic high. Pulse LDT then switches to a logic high a delay time determined by delay circuit 69 after the output of NOR gate 68 switches to a logic high. Pulse WE1 switching to a logic low causes transmission gate to become nonconductive and P channel transistor to provide a logic high to NAND gate 66 and thus terminating pulse WDE. The delay time between the transition of signal WE1 and the termination of pulse WDE plus the specified delay between a data transition and the termination of the write mode is sufficient for write driver 18 to perform the required write. Pulse LDT at a logic high enables transistors 53 and 54 to precharge data lines 47 and 48 and the selected bit line pair to the necessary level as required to perform the subsequent read. The duration of pulse LDT is set by the delay from signal WE1 switching to a logic low and the output of inverter 67 switching to a logic high. The pulse width of pulse LDT can be relatively short because bipolar transistors 53 and 54 can couple charge very rapidly. The delay of delay circuit 69 ensures that pulse LDT will not occur until write driver 18 is disabled. Precharging of data lines 14 does occur in response to a data transition which occurs during the write mode in response to pulse LDT. Pulse LDT is suppressed, however, if signal WDE becomes inactive before signal WE1 switches to a logic low. Pulse LDT is not necessary in such a case because transistors 51 and 52 have enough time to provide the requisite precharging before the read begins.

The WDE pulse is generated only for a logic low to logic high transition of signal WE1 or a data transition while signal WE1 is a logic high. While signal WE1 is a logic low, transmission gate 62 is non-conductive so that pulse *DT is decoupled from NAND gate 66. Furthermore, P channel transistor 64 provides a logic high to NAND gate 66 while signal WE1 is a logic low. For a logic high to logic low transition of signal WE1, NAND gates maintains a logic high output. Just prior to the transition, delay circuit 70 outputs a logic low to NAND gate 65. Upon the logic high to logic low, delay circuit 70 will provide a logic high output but only after NAND gate 65 has already received the logic low of signal WE1 so that NAND gate 65 maintains a logic high output during this transition.

Thus it is seen that precharging the data lines in response to a data transition is useful for write recovery. There is a self-timed write which is used for the case in which the data is not changed during the write mode. This approach is known to have advantages for high speed applications. Flexibility is added by allowing data changes during the write mode. This is provided while still providing high speed operation by having a timed write following the detection of a data transition and further by enhancing the write recovery with a circuit which is also responsive to the data transition.

Thus, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

We claim:

1. A memory having a read mode and a write mode, comprising:
   an array of memory cells coupled to bit line pairs and word lines at intersections thereof;
   a pair of data lines;
   output means, coupled to the pair of data lines, for providing an output signal representative of a logic state present on the data lines when the memory is in the read mode;
   input means, coupled to the pair of data lines, for driving the pair of data lines to a logic state representative of a logic state of an input signal when the input means is enabled by a write enable pulse;
   first precharge means, coupled to the data lines, for precharging the data lines in response to a data transition pulse;
   generator means, coupled to the input means, for providing the write enable pulse in response to the memory making a transition from the read mode to the write mode, providing the write enable pulse in response to a change in logic state of the input signal when the memory is in the write mode, and providing the data transition pulse in response to the memory making a transition from the write mode to the read mode during the write enable pulse, said data transition pulse delayed in time from said write enable pulse;
   column decoder means, coupled to the bit line pairs, for coupling a selected bit line pair to the pair of data lines as determined by a column address; and row decoder means, coupled to the work lines, for enabling a selected word line as determined by a row address.

2. The memory of claim 1 wherein the first precharge means comprises:
a pair of transistors coupled to the pair of data lines and enabled by the data transition pulse.

3. The memory of claim 2, wherein the pair of transistors are bipolar transistors.

4. The memory of claim 3, further comprising:
second precharge means, coupled to the data lines, for precharging the data lines, said data line charging means being disabled in response to the generator means providing the write enable pulse.

5. The memory of claim 4, wherein the second precharge means comprises a pair of transistors coupled to the data lines and disabled by the write enable pulse.

6. The memory of claim 1, further comprising:
second precharge means, coupled to the data lines, for precharging the data lines, said data line charging means being disabled in response to the generator means providing the write enable pulse.

7. The memory of claim 6, wherein the second precharge means comprises a pair of transistors coupled to the data lines and disabled by the write enable pulse.

* * * * *

UNITED STATES PATENT AND TRADEMARK OFFICE
CERTIFICATE OF CORRECTION

PATENT NO. : 4,802,129
DATED : January 31, 1989
INVENTOR(S) : George P. Hoekstra and Perry H. Pelley, III It is certified that error appears in the above-identified patent and that said Letters Patent is hereby corrected as shown below:

Column 7, line 1, change "work" to --word--.

Signed and Sealed this

Fourth Day of July, 1989

Attest:

DONALD J. QUIGG

Attesting Officer

Commissioner of Patents and Trademarks